United States Patent [19]

Tsunoda et al.

[11] Patent Number: 4,929,563
[45] Date of Patent: May 29, 1990

[54] METHOD OF MANUFACTURING SEMICONDUCTOR DEVICE WITH OVERVOLTAGE SELF-PROTECTION

[75] Inventors: Yoshiaki Tsunoda, Kawasaki; Masatoshi Kanaya, Yokohama, both of Japan

[73] Assignee: Kabushiki Kaisha Toshiba, Kawasaki, Japan

[21] Appl. No.: 272,842

[22] Filed: Nov. 18, 1988

[30] Foreign Application Priority Data

Nov. 21, 1987 [JP] Japan ................................ 62-294364

[51] Int. Cl.⁵ .................. H01L 21/223; H01L 21/265
[52] U.S. Cl. ...................................... 437/6; 437/203; 437/228; 437/38; 357/38
[58] Field of Search ................ 357/37, 38, 39; 437/6, 437/38, 203, 228

[56] References Cited

U.S. PATENT DOCUMENTS

| 4,514,898 | 5/1985 | Przybysz et al. | 437/6 |
| 4,516,315 | 5/1985 | Przybysz et al. | 437/6 |
| 4,555,845 | 12/1985 | Przybysz et al. | 437/6 |

FOREIGN PATENT DOCUMENTS

| 0209986 | 1/1987 | European Pat. Off. | 437/6 |
| 2628793 | 12/1977 | Fed. Rep. of Germany | 357/38 T |

OTHER PUBLICATIONS

J. X. Przybysz, "Laser Trimming of Thyristors to Add an Overvoltage Self-Protected Turn-On Feature," 0275-9306/85/0000-0463, 1985, IEEE, pp. 463-468.
V. A. K. Temple, "Controlled Turn-on Thyristors," IEEE Transactions on Electron Devices, vol. Ed-30, No. 7, Jul. 1983, pp. 816-824.

*Primary Examiner*—Brian E. Hearn
*Assistant Examiner*—T. Thomas
*Attorney, Agent, or Firm*—Finnegan, Henderson, Farabow, Garrett, and Dunner

[57] ABSTRACT

A method of manufacturing a semiconductor device with overvoltage self-protection of punchthrough type comprises the following steps.

(a) A step of making a recess in a P gate-base layer from its surface exposed to the top surface of a substrate. In this step, the recess is formed to such depth that a space-charge layer produced in the gate-base layer when a predetermined breakover voltage for self-protection is applied to a thyristor reaches at least the bottom of the recess, and the bottom of the recess extends close to a junction between the gate-base layer and an emitter layer.

(b) A step of doping the gate-base layer with P type impurities from the bottom of the recess to gate-base layer to form a region of low impurity concentration just under the bottom of the recess. The amount (atoms/cm²) of the P type impurities is substantially equal to $N_D \times 1$ which is the product of the depth l (cm) of the space-charge layer produced in the base layer when the breakover voltage is applied to the thyristor and the impurity concentration $N_D$ (atoms/cm³) of an N base layer.

(c) A step of forming an electrode on the surface of the recess.

13 Claims, 5 Drawing Sheets

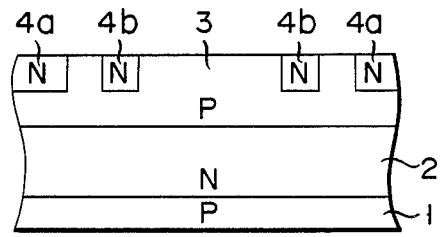
F I G. 1A
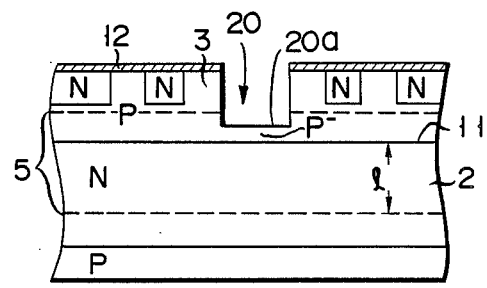
F I G. 1B
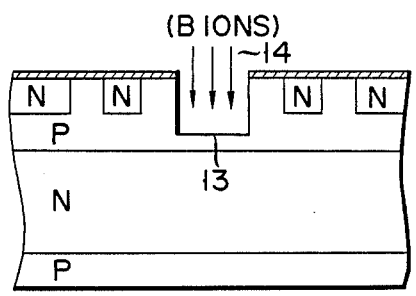
F I G. 1C

METHOD OF MANUFACTURING SEMICONDUCTOR DEVICE WITH OVERVOLTAGE SELF-PROTECTION

BACKGROUND OF THE INVENTION

1. Field of the Invention

The present invention relates to thyristors (including a light-activated thyristor) with an overvoltage self-protection function of punchthrough type and, more particularly, to a thyristor manufacturing method which can precisely realize the breakover voltage at which the punchthrough occurs and is particularly used for manufacturing thyristors used for a high-voltage conversion application in direct-current power transmission.

2. Description of the Related Art

In the field of high-power thyristors used for high-voltage converting applications, thyristors with overvoltage self-protection function have been developed. Many of the thyristors with overvoltage protection are of the avalanche type. This type of thyristor is described in "Controlled Turn-on Thyristors", by VICTOR A. K. TEMPLE, IEEE, Trans. Electron Devices, ED-30, pp. 816–824 (1983) GE.

In the case of this avalanche type, formed in a part of the P gate-base layer of a thyristor of PNPN structure is a region in which avalanche breakdown is more likely to occur than other parts. In the operation of overvoltage protection, the avalanche-breakdown first occurs in the region by means of a transient voltage at the rise of an overvoltage and thus a nondestructive current flows through the region with the result that a pilot thyristor is turned on and subsequently a main thyristor is turned on to decay the overvoltage, thereby protecting the thyristor.

In an intermediate process of manufacture of avalanche type devices a gate-base region for avalanche breakdown is formed. When completed, therefore, the devices will have varying breakover voltages because of variations in material or in process. Since the avalanche voltage has positive temperature dependency, the breakover voltage naturally has temperature dependency. This means that the breakover voltage is higher at room temperature than at high temperature, making it difficult to design thyristor devices, particularly in the respects of their withstanding voltages and di/dt ratings.

A thyristor with overvoltage self-protection of punchthrough type is disclosed in a paper entitled "LASER TRIMMING OF THYRISTORS TO ADD AN OVERVOLTAGE SELF-PROTECTED TURN-ON FEATURE" by J. X. Przybysz, IEEE 1985, pp. 463–468.

FIG. 3 shows a modification of a punchthrough type thyristor illustrated in FIG. 2 on page 464 of the above paper, to which the present invention is not applied. This device comprises a main thyristor having a four-layer structure comprised of a P emitter layer 1, an N base layer 2, a P gate-base layer 3 and N emitter layers 4a; a pilot thyristor having a four-layer structure comprised of P emitter layer 1, N base layer 2 and P gate-base layer 3 which are all common to the main thyristor, and N emitter layers 4b surrounded with N emitter layers 4a; and a recess 20 of a gate portion surrounded with the pilot thyristor. Reference numeral 6 denotes an anode electrode, 7 a cathode electrode, 8 a gate electrode, and 9 an amplifying gate electrode (a cathode electrode of the pilot thyristor).

In this punchthrough type, a space-charge layer 5 (the region between broken lines 5a, 5b) is formed in a junction 11 between P gate-base layer 3 and N base layer 2 by a forward voltage applied to the thyristor, and this region 5 extends with an increase in the forward voltage. When the forward voltage is increased to the breakover voltage (hereinafter referred to as the self-protection breakover voltage) at which the self-protective operation starts, the boundary 5a of space-charge layer 5 reaches bottom 20a of the recess of P gate-base layer 3 so that the punchthrough occurs. Consequently, the current flowing through junction 11 acts as a gate current of the pilot thyristor (1, 2, 3, 4b) to turn it on. Immediately after the pilot thyristor is turned on, the main thyristor (1, 2, 3, 4a) is safely turned on, thereby protecting the main thyristor.

Space-charge layer extending to P gate-base region 3 becomes narrow because the impurity concentration of layer 3 is much higher than that of N base 2. Although being possible in the stage of laboratory, therefore, the precise control of the self-protection breakover voltage is very difficult to attain from the viewpoint of mass productivity.

FIG. 4A shows a structure model of a punchthrough type thyristor, while FIG. 4B is a graph showing the relationship between a distance $W_{PB}$ from bottom 20a of the recess to junction 11 and a breakover voltage Vbo at which the punchthrough occurs in P gate-source layer 3. As can been seen from FIG. 4B, the breakover voltage Vbo varies greatly as the distance $W_{PB}$ varies slightly. It will thus be found that the precise control of the self-protection breakover voltage is difficult to attain. (It is to be noted that, in FIG. 4B, $W_{PB}$ is represented by the linear scale, while Vbo is represented by the logarithmic scale.) The distance $W_{PB}$ varies with the profile of the impurity concentration of the P gate-base layer.

To solve the above problems, it is required to determine the depth of the recess for each of thyristor pellets, for example, by monitoring them with a voltmeter, in order for the P gate-base layer below the recess to accurately cause the punchthrough at a self-protection breakover voltage.

As described above, the problems with the conventional method of manufacturing thyristors with overvoltage self-protection are that: it is difficult to determine the self-protection breakover voltage with precision in intermediate processes of manufacture; and thus the complete devices have great variations in their breakover voltage. The method utilizing the voltmeter for monitor can solve the above problems, but is not suitable for mass production because many manufacturing processes are involved.

SUMMARY OF THE INVENTION

It is accordingly an object of the present invention to provide a thyristor manufacturing method which can mass-produce a thyristor, in which variations in the self-protection breakover voltage are small, at substantially the same manufacturing yield and cost as in the case of production of an ordinary thyristor.

For a better understanding of the present invention, a method for attaining the above object will be described with reference to an embodiment of FIG. 1 in which one conductivity type is N type, while an opposite conductivity type is P type.

The present invention is directed to a method of manufacturing a semiconductor device with overvoltage self-protection of punchthrough type. The method comprises the following steps in manufacturing a thyristor having a four-layer structure of N emitter layers 4a, 4b, a P gate-base layer 3, an N base layer 2 and a P emitter layer 1.

(a) A step of making a recess 20 in P gate-base layer 3 from its surface exposed to the top surface of a substrate. In this step, recess 20 is formed to the depth in which a space-charge layer produced in gate-base layer 3 when a predetermined breakover voltage Vbo for self-protection is applied to the thyristor reaches at least bottom 20a of the recess, and bottom 20a of the recess extends close to the junction between gate-base layer 3 and emitter layer 2.

(b) A step of introducing P type impurities from bottom 20a of the recess to gate-base layer 3 to form a region 3x of low impurity concentration just under bottom 20a of the recess. The amount (atoms/cm$^2$) of the P type impurities is substantially equal to $N_D \times 1$ which is the product of the depth 1 (cm) of the space-charge layer produced in the N base layer when the breakover voltage is applied to the thyristor and the impurity concentration $N_D$ (atoms/cm$^3$) of N base layer 2.

(c) A step of forming an electrode 18 on the surface of recess 20a.

The amount (atoms/cm$^2$) of the P type impurities introduced from the bottom of the recess is defined as the amount per unit area (cm$^2$) of the junction surface.

The present invention utilizes the following functions of a thyristor.

When a predetermined forward voltage Vbo equal to a self-protection voltage is applied to a thyristor, a reverse voltage that is substantially equal to the forward voltage is applied across junction 11 between P gate-base layer 3 and N base layer 2 whereby space-charge region 5 is formed to extend on either side of junction 11. The product $N_D \times 1$ (atoms/cm$^2$) of the depth 1 (cm) and the impurity concentration $N_D$ (atoms/cm$^3$) of the space-charge layer on the side of N base layer 2, that is, the amount (atoms/cm$^2$) of impurities per square centimeter of the space-charge layer on the side of the N base layer becomes equal to the corresponding amount (atoms/cm$^2$) of impurities of the space-charge layer on the P gate-base layer. In addition, if the forward voltage Vbo and $N_D$ are determined, then $N_D \times 1$ will be found from theoretical calculation. Hence, it is possible in mass-producing processes to make the amount of the P-type impurities in the P$^-$-type gate-base layer 3x extending from bottom 20a of the recess (on the surface of which electrode 18 is formed) to a portion of junction 11 that is just under the recess substantially equal to the $N_D \times 1$. In such a thyristor, the punchthrough occurs in P$^-$-gate-base layer 3x under bottom 20a of the recess at the forward voltage Vbo.

In the present invention, the bottom 20a of recess 20 is formed near to junction 11 between base layers 2 and 3. That is, the recess is formed so that its bottom 20a may reach a region, within a transition region in which the conductivity type changes from P type to N type, in which the amount (atoms/cm$^2$) of impurities per unit area of junction 11 under bottom 20a of the recess becomes negligibly small as compared to $N_D \times 1$. In the present invention, therefore, the self-protection breakover voltage Vbo at which the punchthrough occurs is determined by the amount of impurities per unit area of junction 11, which are introduced from the bottom 20a of the recess. The depth of recess 20 has no direct effect on the breakover voltage Vbo. The amount of impurities to be introduced is precisely controlled by the use of an ion implantation technique, for example. Thus the variations in the self-protection breakover voltage can be reduced significantly.

The ground for the invention will be described. FIGS. 2A and 2B show the density of electric charge ρ and electric field E in a PN stacked junction with reverse bias. FIG. 2C shows the position X0 of the PN junction, the end X1 of a space-charge layer on the side of P-type layer and the end X2 of the space-charge layer on the side of N-type layer. The axis of abscissa represents the distance X in the direction normal to the plane of the junction. In FIG. 2A, $X_p$ and $X_n$ represent the partial widths of the space-charge layer (depletion layer) in the P- and N-type layers of the junction, respectively, and hence the total width of the space-charge layer is $W = X_p + X_n$. The electric-charge density ρ is given by the product of the charge q (absolute value) of an electron and the impurity concentration. Thus, the p-type and N-type layers have an impurity concentration of $-qN_A$ and $qN_D$, respectively. The electric charges $qN_A \times X_p$ and $qN_D \times X_n$ of the P and N layers per unit area of the junction in the space-charge layer are equal to each other. FIG. 2B shows the distribution of the electric field which is obtained by integrating the distribution of the electric charge in FIG. 2A. The width of the space-charge layer obtained when a predetermined reverse voltage is applied can be found on the basis of the distribution of the electric field.

It is required that the amount of impurities (P$^-$) under bottom 20a of the recess be negligibly small as compared to the amount of P-type impurities of $N_D \times X_n$ (atoms/cm$^2$) which are introduced after the formation of recess 20 shown in FIG. 2C, so that a p$^-$ layer 3x of very low impurity concentration may be formed. Moreover, taking NA >> ND into consideration, recess 20 must be formed to the depth very close to PN junction 11 in a transition region from P type to N type.

In usual thyristors, a portion of an N-type substrate is used for the N base layer, and the P gate-base layer is formed by diffusing impurities from the major surface of the substrate. Hence such an ideal abrupt junction as shown in FIG. 2A cannot be formed. The P and N layers are equal to each other in the amount of electric charges per unit area in the space-charge layer so that $qN_AX_p = qN_DX_n$. If the self-protection voltage Vbo is determined, then $N_AX_p$ will be found from theoretical calculation. Xn can thus be calculated from Vbo and $N_D$ as $X_n = N_AX_p/N_D$. The amount $(qN_DX_n)$ of electric charges per unit area of P$^-$ layer 3x under the bottom of the recess in the space-charge layer can also be found.

BRIEF DESCRIPTION OF THE DRAWINGS

FIGS. 1A through 1E show principal manufacturing processes for a punchthrough type thyristor embodying the present invention, more specifically, FIG. 1A shows a state of the thyristor prior to the formation of a recess 20, FIG. 1B shows a state after the formation of recess 20, FIG. 1C shows the state in which a predetermined amount of boron ions is implanted into the bottom 20a of recess 20, and FIG. 1E shows a sectional structure of the complete punchthrough type thyristor;

DETAILED DESCRIPTION OF THE PREFERRED EMBODIMENTS

Figure 1D:
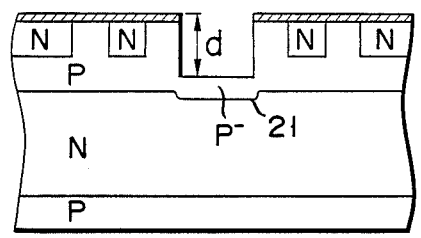

Preferred embodiments of this invention will be described with reference to the accompanying drawings.

As shown in FIG. 1A, P-type impurities are diffused in an N-type semiconductor substrate 2 from its major surfaces (the upper and lower surfaces in the Figure) to form a P emitter layer 1 and a P gate-base layer 3. Furthermore, N-type impurities are selectively diffused in P gate-base layer 3 using a mask not shown to form N emitter layers 4a for a main thyristor and N emitter layers 4b for a pilot thyristor. Thus, a four-layer structure of NPNP in which a portion of N-type substrate 2 is used as N base layer 2 is obtained.

Figure 5:
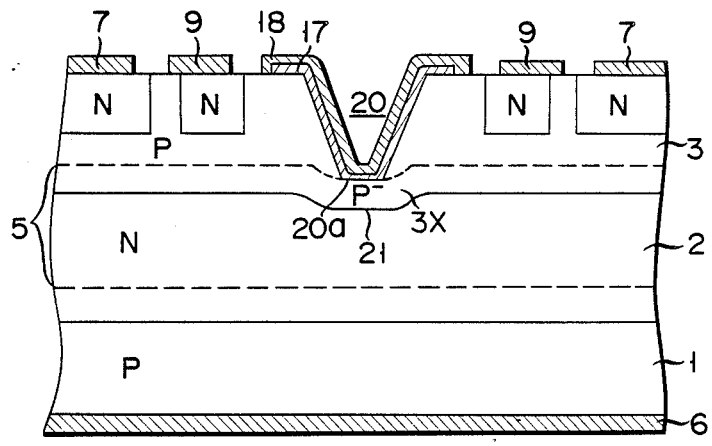
FIG. 5 shows a modification of the thyristor of FIG. 1E in which the recess 20 has the shape of the letter "V" in section.

Subsequently, as shown in FIG. 1B, a layer 12 of oxide ($SiO_2$) is formed over the major surface (the upper surface of the Figure) of the substrate on the side of a cathode and then a recess 20 is formed by the use of the oxide layer as a mask. The formation of recess 20 may be performed by a laser processing technique, a wet etching technique, a dry etching technique such as CDE, a grindstone processing technique or a combination thereof. In this embodiment, recess 20 can be formed by the grindstone cutting and subsequent light wet etching. The depth d of recess 20 is such that its bottom 20a reaches a space-charge layer 5 produced in P gate-base layer 3 when the self-protection breakover voltage Vbo is applied to the thyristor. Moreover, the bottom 20a of the recess is at a position, within a transition region (3x) of conductivity type from P type to N type, the impurity concentration at which is negligibly low as compared with the amount of impurities, such as boron ions, introduced by a subsequent process, for example, below $10^{15}$ atoms/$cm^3$. If this requirement is met, the bottom 20a of recess 20 may go under junction 11. Further, if this requirement is met, recess 20 may be of a V shape in section as shown in FIG. 5.

Next, the amount (atoms/$cm^2$) of P type impurities 14, which is equal to the product $N_D \times 1$ (atoms/$cm^2$) of the impurity concentration $N_D$ (atoms/$cm^3$) of N base layer 2 and the depth 1 (cm) of space-charge layer 5 produced in N base layer 2 when the self-protection voltage is applied to the thyristor as shown in FIG. 1B, is introduced into the bottom of the recess as shown in FIG. 1C. It is desired that the amount of impurities be precisely controlled by the use of an ion implantation technique. The impurities 14 may be any of P-type impurities such as boron or garium.

Subsequently, as shown in FIG. 1D, the activation and diffusion of the implanted ions of boron are performed by heat treatment to form a desired PN junction 21.

Figure 1E:
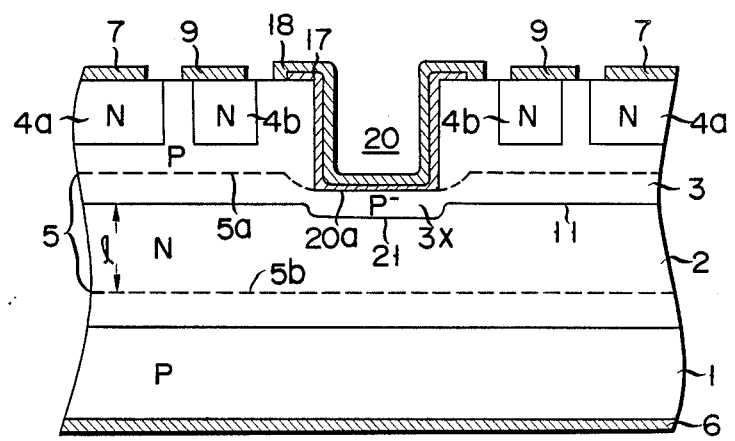
Figure 2A:
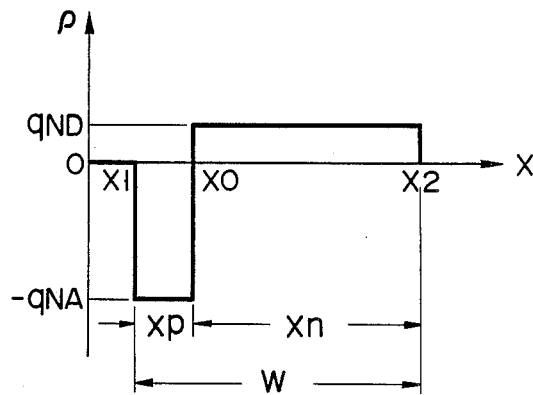
FIGS. 2A through 2C are reference diagrams for theoretically explaining the ground for the present invention.
Figure 2B:
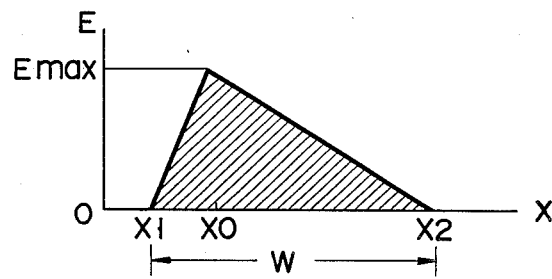
Figure 2C:
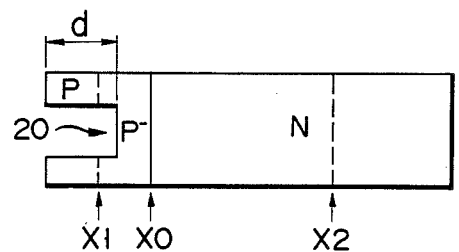
Figure 3:
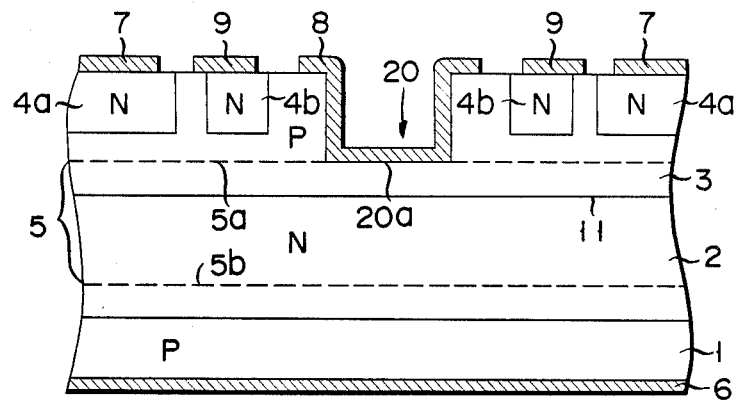
FIG. 3 is a sectional view of a thyristor which corresponds to the thyristor shown in FIG. 1E and is manufactured without the use of the manufacturing method of the present invention.
Figure 4A:
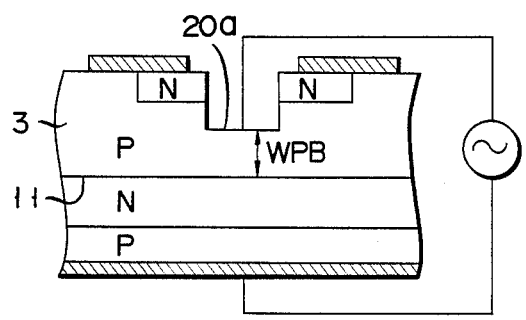
FIG. 4A shows a sectional structure model of the punchthrough type thyristor.
Figure 4B:
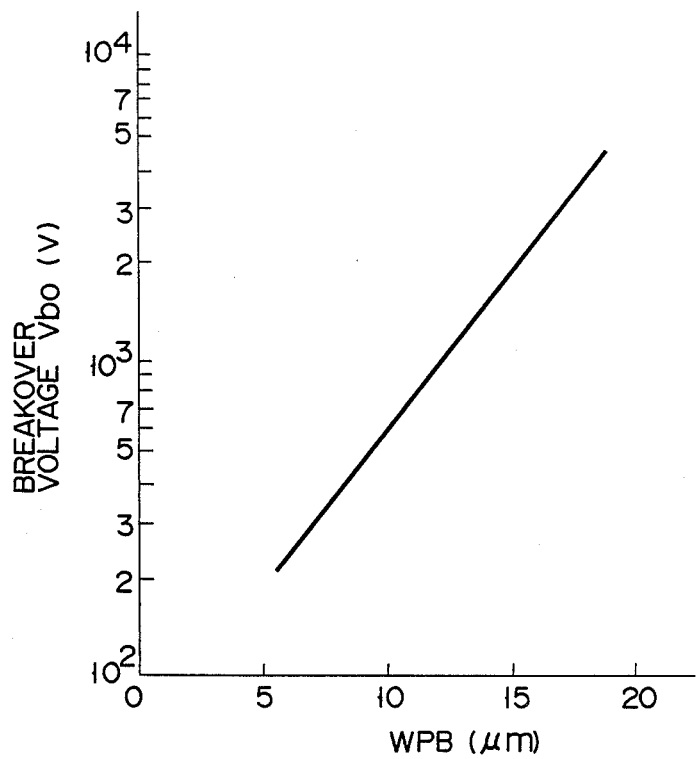
FIG. 4B is a graph showing the relationship between the breakover voltage Vbo and the distance $W_{PB}$ from recess bottom 20a to junction 11 of the model of FIG. 4A.

Next, as shown in FIG. 1E, after the surface of recess 20 is covered with a layer 17 of molybdenum silicide ($MoSi_2$), an anode electrode 6, a cathode electrode 7, an amplifying gate electrode 9 and a gate electrode 18, which are all made of aluminum, are formed by a conventional method. Aluminum is usually used for the gate electrode.

In order to provide good ohmic contact between aluminum and silicon, if aluminum is sintered at a high temperature to produce a layer of alloy Al-Si, the amount of impurities under bottom 20a of recess 20 which has been precisely controlled would differ because of the layer of alloy. For this reason, it is desired that a metal such as molybdenum silicide ($MoSi_2$), which does not make a layer of alloy with silicon at a sintering temperature of aluminum, be formed on the surface of recess 20 before the evaporation of aluminum. Instead of $MoSi_2$, a silicide of Ti, Ni, or V may be used.

When a forward overvoltage is applied to a thyristor manufactured as described above, and a transient voltage occurring at the rise of the overvoltage reaches the self-protection breakover voltage Vbo, the punchthrough occurs in the recess 20. As a result, a current resulting from the punchthrough flows into the gate of the pilot thyristor (1, 2, 3, 4b) to turn it on, and the main thyristor (1, 2, 3, 4a) is subsequently turned on, so that the thyristor is protected from the overvoltage.

The manufacturing method of the present invention may be applied to thyristors having no pilot thyristor structure, ordinary electrically-activated thyristors and light-activated thyristors.

The conventional manufacturing method for thyristors with overvoltage self-protection of punchthrough type has difficulty in precisely determining the self-protection breakover voltage Vbo in an intermediate process of manufacture, or is not suitable for mass-production of thyristors because of the necessity of monitoring the breakover voltage for each of thyristor pellets to form recess 20. However, according to the manufacturing method of the present invention, if the amount of impurities introduced in the P− layer of low impurity concentration under bottom 20a of the recess is only controlled, the self-protection breakover voltage with little variation can readily be obtained. Further, the amount of impurities introduced from bottom 20a of the recess can easily be controlled by the use of an ion implantation technique, for example. The manufacturing method of the present invention is suitable for mass-productivity and can utilize existing techniques.

Consequently, the present invention can provide a manufacturing method which can mass-produce thyristors with little variations in the self-protection breakdown voltage at the same yield and cost as in the case of ordinary thyristors.

The use of a thyristor according to the present invention will save the need of an overvoltage protection circuit which is provided in conventional equipment and thus decrease the bulk of the equipment. This provides advantages of cost down and high reliability. The self-protection breakdown voltage has no temperature dependency, easing the design of equipment.

What is claimed is:

1. A method of manufacturing a semiconductor device with overvoltage self-protection, comprising a four-layer structure extending from a top surface to a bottom surface of a semiconductor substrate and including an emitter layer of one conductivity type, a gate-base layer of an opposite conductivity type, a base layer of said one conductivity type and another emitter layer of said opposite conductivity type, said method comprising the steps of:

a first step of making a recess in said gate-base layer from its surface exposed to the top surface of said substrate, the depth of said recess being such that the bottom of said recess reaches at least a space-charge layer produced in said gate-base layer when a predetermined forward voltage is applied to said semiconductor device, and further extends close to a junction between said base layer and said gate-base layer;

a second step of doping said semiconductor substrate with impurities of said opposite conductivity type from the bottom of said recess to form a region under said recess having an impurity concentration lower than said gate-base layer, the amount of said impurities being substantially equal to $N_D \times 1$ (atoms/cm$^2$) which is the product of the depth l (cm) of the space-charge layer produced in said base layer when the forward voltage is applied to said semiconductor device and a concentration $N_D$ (atoms/cm$^3$) of impurities of said one conductivity type in said base layer; and a third step of forming an electrode on the surface of said recess.

2. A method according to claim 1, wherein said second step, said impurities of said opposite conductivity type are introduced into said semiconductor substrate by the use of an ion implantation technique.

3. A method according to claim 1, wherein said semiconductor substrate is formed of silicon, and wherein, after the surface of said recess is covered with a layer of a metal which is not alloyed with silicon at a temperature used in forming said electrode in said third step, said electrode is formed over said layer of said metal.

4. A method according to claim 3, wherein said metal is selected from the group consisting of Mo, Ti, Ni and V.

5. A method according to claim 1, wherein said recess (20) is of a cylindrical shape, and its bottom (20a) has a portion substantially parallel to said junction (11) between said gate-base layer (3) and said base layer (2).

6. A method of manufacturing a thyristor comprising a four-layer structure extending from a top surface to a bottom surface of a semiconductor substrate and including coaxial ring-like emitter layers of one conductivity type, a gate-base layer of an opposite conductivity type, a base layer of said one conductivity type and an anode layer of said opposite conductivity type, said method comprising the steps of:

a first step of making a recess in said gate-base layer from its surface exposed to the top surface of said substrate, the depth of said recess being determined such that the bottom of said recess reaches a space-charge layer produced in said gate-base layer if a predetermined forward voltage is applied to said thyristor, and further extends close to a junction between said base layer and said gate-base layer;

a second step of doping said semiconductor substrate with impurities of said opposite conductivity type from the bottom of said recess to form a region under said recess having an impurity concentration lower than said gate-base layer, the amount of said impurities being substantially equal to $N_D \times 1$ (atoms/cm$^2$) which is the product of the depth l (cm) of the space-charge layer produced in said base layer when the forward voltage is applied to said thyristor and a concentration $N_D$ (atoms/cm$^3$) of impurities of said one conductivity type in said base layer; and a third step of forming an electrode on the surface of said recess.

7. A method according to claim 6, wherein said second step, said impurities of said opposite conductivity type are introduced into said semiconductor substrate by the use of an ion implantation technique.

8. A method according to claim 6, wherein said semiconductor substrate is formed of silicon, and wherein, after the surface of said recess is covered with a layer of a metal which is not alloyed with silicon at a temperature used in forming said electrode in said third step, said electrode is formed over said layer of said metal.

9. A method according to claim 8, wherein said metal is selected from the group consisting of Mo, Ti, Ni and V.

10. A method according to claim 6, wherein said recess is of a cylindrical shape, and its bottom has a portion substantially parallel to said junction between said gate-base layer and said base layer.

11. A method of manufacturing a thyristor comprising a four-layer structure extending from a top surface to a bottom surface of a semiconductor substrate and including an emitter layer of one conductivity type, a gate-base layer of an opposite conductivity type, a base layer of said one conductivity type and an anode layer of said opposite conductivity type, said method comprising the steps of:

a first step of making a recess in said gate-base layer from its surface exposed to the top surface of said substrate, the depth of said recess being determined such that the bottom of said recess reaches a space-charge layer produced in said gate-base layer if a predetermined forward voltage is applied to said thyristor;

a second step of doping said semiconductor substrate with impurities of said opposite conductivity type from the bottom of said recess to form a region under said recess having an impurity concentration lower than said gate-base layer, the amount of said impurities being substantially equal to $N_D \times 1$ (atoms/cm$^2$) which is the product of the depth l (cm) of the space-charge layer produced in said base layer when the forward voltage is applied to said thyristor and a concentration $N_D$ (atoms/cm$^3$) of impurities of said one conductivity type in said base layer; and a third step of forming an electrode on the surface of said recess, wherein said semiconductor substrate is formed of silicon, and after the surface of said recess is covered with a layer of a metal which is not alloyed with silicon at a temperature used in forming said electrode in said third step, said electrode is formed over said layer of said metal.

12. A method according to claim 11, wherein said metal is selected from the group consisting of Mo, Ti, Ni and V.

13. A method according to claim 11, wherein the button of said recess has a portion substantially parallel to said junction between said gate-base layer and said base layer.

* * * * *